United States Patent [19]

Haug et al.

[11] 4,267,465
[45] May 12, 1981

[54] CIRCUIT FOR RECHARGING THE OUTPUT NODES OF FIELD EFFECT TRANSISTOR CIRCUITS

[75] Inventors: Werner Haug, Boeblingen; Joerg Gschwendtner, Esslingen; Robert Schnadt, Boeblingen, all of Fed. Rep. of Germany

[73] Assignee: IBM Corporation, Armonk, N.Y.

[21] Appl. No.: 3,164

[22] Filed: Jan. 15, 1979

[30] Foreign Application Priority Data

Jun. 6, 1978 [DE] Fed. Rep. of Germany ....... 2824727

[51] Int. Cl.³ .......................... H03K 5/00; H03K 3/26
[52] U.S. Cl. ........................... 307/238.3; 307/DIG. 3; 307/279
[58] Field of Search .................. 307/DIG. 3, 238, 279

[56] References Cited
U.S. PATENT DOCUMENTS

| | | | |
|---|---|---|---|
| 3,983,545 | 9/1976 | Cordaro | 307/DIG. 3 |
| 4,030,081 | 6/1977 | Horninger | 307/238 |
| 4,112,510 | 9/1978 | Baker | 307/238 |

*Primary Examiner*—Harold A. Dixon
*Attorney, Agent, or Firm*—Maurice H. Klitzman

[57] ABSTRACT

A recharging circuit is provided to maintain a high potential for a longer time interval at the output node of a FET driver circuit. The recharging circuit consists of a first FET which is made periodically conductive via a capacitor and periodically recharges a capacitance at the output node. This capacitance is first charged by a strong pulse of the driver circuit. A second FET is provided to prevent a current flow through the first FET and thus the generation of a power dissipating current when the output potential of the driver circuit is low. The gate of the second FET is connected to a supply voltage. Thus, the second FET is conductive when a low potential exists at the output node, transferring that potential to the gate of the first FET which, in turn, does not become conductive since its gate to source voltage is less than its threshold voltage.

4 Claims, 3 Drawing Figures

CIRCUIT FOR RECHARGING THE OUTPUT NODES OF FIELD EFFECT TRANSISTOR CIRCUITS

FIELD OF THE INVENTION

The invention concerns a circuit for recharging the output mode of field effect transistor circuits.

BACKGROUND OF THE INVENTION

During the operation of monolithically integrated storage circuits consisting of field effect transistors, hereinafter referred to as FETs, it is necessary with particular applications, for example, addressing a buffer storage, to maintain a particular potential for a comparatively long time interval on the output of a circuit, for example, a driver stage. This requirement has been met in the prior art, for example, by connecting a high impedance FET, which is wired as a two-terminal network serving as a resistor and which is obtained by linking its gate electrode to the drain electrode, with its source electrode to the output node of the driver circuit, while the two other electrodes of the FET, which are connected to each other are linked to the positive pole of the operating voltage source. Via the resistor thus obtained, which in the case of monolithically integrated circuits can also consist of polycrystalline silicon or take the form of a diffused resistor, the input capacitance of the circuit connected to the output node of the driver stage is recharged, so that at this circuit, in spite of the leakage currents of the input capacitance and the driver proper, the required level is maintained for comparatively long time intervals. However, the prior solution described has the disadvantage that the FET wired as a two-terminal network, passes current, thus dissipating power in the resistor whenever the output node of the circuit is at its low potential.

SUMMARY OF THE INVENTION

Therefore, it is the object of the invention to provide a circuit for recharging the output node of a FET driver circuit, that will not consume substantially any power when the output node of the circuit has a low potential.

The above object is accomplished by connecting the drain to source path of a first FET between the gate and source electrodes of a second FET so that when the first FET senses the potential at the source of the second FET, the second FET will be rendered less conductive when the output of the driver circuit is at the low potential level.

BRIEF DESCRIPTION OF THE DRAWINGS

The above and other objects will become more apparent when read in the light of the accompanying specification and drawing wherein.

DETAILED DESCRIPTION

Figure 1:
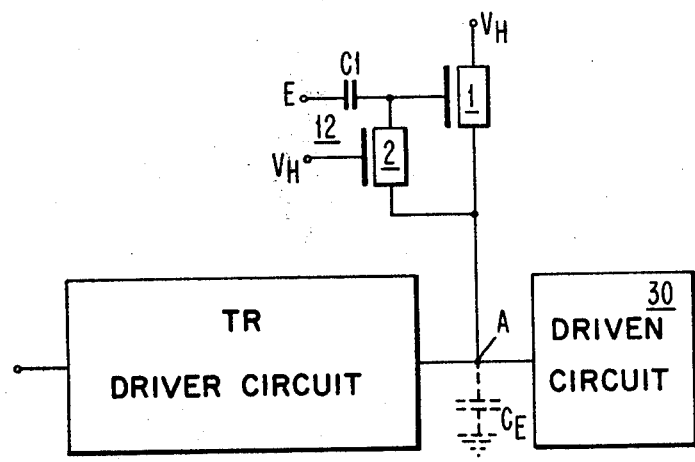
FIG. 1 shows a circuit diagram of the FET circuit in accordance with the invention for recharging the output node of a FET driver circuit.

In FIG. 1, A designates the output node of a FET circuit, for example, a driver circuit TR, illustrated as a block, for controlling a buffer storage, not shown. The input capacitance $C_E$ of the driven circuit 30 connected to the driver circuit is marked by a broken line. Because of leakage currents of the driver and the input capacitance $C_E$, this capacitance has to be periodically recharged, if during a comparatively long time interval a high output potential is required at the output node A of the driver circuit. Capacitance $C_E$ is first charged by a strong pulse of the driver circuit TR. As a result of leakage currents of the driver circuit TR, the output voltage of the latter drops from the value $V_H$, e.g., to that value reduced by twice the threshold voltage $2 V_T$, so that $V = V_H - 2 V_T$. By means of the recharging circuit 12 in accordance with the invention, the voltage at the output A of the driver circuit TR is kept at a value which is slightly below $V_H$. For this purpose, the source electrode of a FET 1 is connected to the output node A of the driver circuit TR, while its drain electrode is linked to the positive pole $V_H$ of the operating voltage source. Source and gate electrodes of the FET 1 are connected to each other via a further FET 2, whose gate electrode is connected to the positive pole $V_H$ of the operating voltage source. The gate electrode of the FET 1 is connected to the input terminal E of the circuit via a coupling capacitor C1.

A positive output potential at output node A is maintained during a longer time interval by periodically applying control pulses of the magnitude of the positive operating voltage $V_H$ to the input terminal E. These pulses are fed, via the coupling capacitor C1, to the gate electrode of the FET 1 which thus is rendered periodically conductive for a short period of time, since the potential at the gate electrode of the FET 1 jumps from about the value $V_H - V_T$ to about the value $2 V_H - V_T$, so that the FET 1 recharges the input capacitance $C_E$.

During this period, the FET 2 remains switched off, because its gate to source voltage $V_{GS}$ is less than its threshold voltage $V_T$. The control pulses at E are made to appear at such time intervals that the input capacitance $C_E$, in the time between the occurrence of two consecutive control pulses, is not noticeably discharged as a result of leakage currents. Such control pulse can be the selection signal for a dynamic storage chip, for example, which, as is known, must activate the chip at regular intervals, in order to recharge the dynamic storage cells.

If the output node A has a low output potential, a current is prevented from flowing through the FET 1 by FET 2 sensing the potential at the source electrode of the FET 1 and transferring that potential to the gate electrode of FET 1. As a result, the FET 1 remains blocked, since between its source electrode and its gate electrode there is no voltage exceeding its threshold voltage. Consequently, the FET 1 does not conduct current and thus dissipate power if the output node A has a low potential. In this state, a low current will flow through the FET 2 only during the time in which the input pulse at E rises. If it is desired that this low current flow be prevented as well, this can be achieved by means of the circuit illustrated in FIG. 2.

Figure 2:
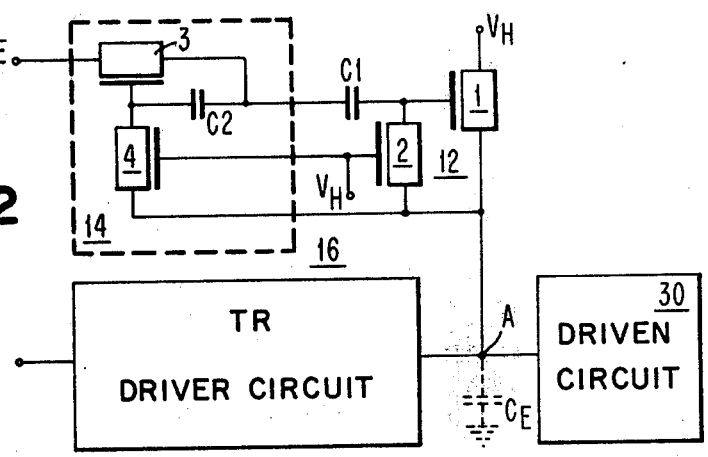
FIG. 2 shows the circuit diagram of an improved circuit in accordance with the invention.

In the circuit 16 of FIG. 2, the elements of circuit 12 correspond to those of circuit 12 in FIG. 1 and bear the same reference numbers. The circuit 16 of FIG. 2 differs from FIG. 1 by the addition of the inserted circuit 14 within the broken line. This additional circuit consists of a further FET 3, whose drain electrode is connected to the input terminal E. The source electrode of the FET 3 is connected to one electrode of the capacitor C1 and, via a capacitor C2, to its gate electrode. The gate electrode of the FET 3 is linked to the output node A via a further FET 4, whose gate electrode is connected to the positive pole $V_H$ of the supply voltage.

OPERATION

The operation of the circuit in accordance with FIG. 2 is as follows. If the output node A, which is assumed to be the output node of a FET driver circuit, has a low potential, this potential is transferred to the gate electrode of the FET 3 by means of the conductive FET 4 because the gate to source potential for the FET 4 is greater than its threshold voltage, $V_T$. If one of the periodically recurring input pulses at E, whose magnitude corresponds to the positive operating voltage $V_H$, appears at that stage, then the input pulse of the FET 3 is not transferred to the capacitor C1, since the FET 3 is nonconductive, because its gate to source voltage $V_{GS}$ is less than its threshold voltage $V_T$. Thus, the periodic input pulses at E are not transferred to the output node A through the FET 2.

If the output node A has a high output potential, this potential is transferred to the gate electrode of the FET 3 via the conductive FET 4. The gate capacitance of the FET 3 and the capacitor C2 are thus precharged to the high output potential which will not drop by more than the magnitude of the threshold voltage of FET 4, otherwise the function of the circuit connected to the output node A will be impaired. If, subsequently, an input pulse appears at the drain electrode E of the FET 3, then such an input pulse will be transferred in full by the FET 3, since at that stage, because of the precharged state of the gate capacitance and of capacitor C2, the gate to source voltage $V_{GS}$ will be essentially higher than the threshold voltage $V_T$ of FET 3, by virtue of the bootstrapping principle. The input pulse at E reaches the gate electrode of the FET 1 via the capacitor C1, rendering FET 1 conductive, so that the input capacitance $C_E$ of the driven circuit 30 connected to the output node A will be periodically recharged.

Because of this, the potential at the output node A retains its high value for a comparatively long period of time.

EXAMPLE OF AN APPLICATION OF THE INVENTION

Figure 3:
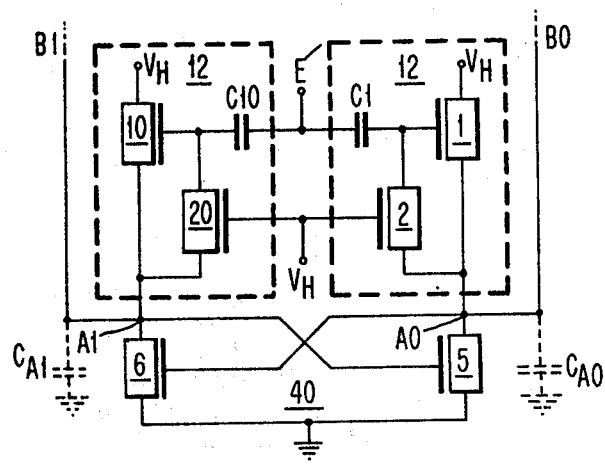
FIG. 3 shows the circuit in accordance with the invention as applied to a semiconductor storage cell.

FIG. 3 shows the invention of the circuit 12 of FIG. 1 applied to a flip-flop 40 made up of field effect transistors 5 and 6, which can be used, for example, in a buffer storage. In the case of the flip flop 40 of FIG. 3, the two load elements, which are usually made up of one FET each in which the gate electrode is connected to the drain electrode, are replaced by one each of the inventive circuits 12 as shown within the broken lines, in accordance with FIG. 1. The circuit elements replacing the load element in the right-hand branch of the flip-flop 40, are designated as FET 1, FET 2, and capacitor C1 in FIG. 1. The corresponding circuit elements in the left branch are FET 10, FET 20, and capacitor C10, respectively. The two circuit elements of the flip-flop 40 are FETs 5 and 6 which are connected to read/write lines B0 and B1, respectively, at the two output nodes A0 and A1, respectively of the flip-flop 40. The capacitances available on the two output nodes A0 and A1 are marked by a broken line and are designated as $C_{A0}$ and $C_{A1}$, respectively.

The flip-flop 40 is, for example, in a first state where the output node A1 has a low potential and the output node A0 a high potential. If this first state is to be maintained for a comparatively long time interval, then discharging of the output node A0 as a result of leakage currents of the capacitance $C_{A0}$ is compensated by the capacitance $C_{A0}$ being periodically recharged by the pulses applied to the input terminal E through the right-hand branch circuit 12. A circuit flow is prevented from flowing from the positive pole $V_H$ of the operating voltage source via the FET 10 in the left-hand branch circuit 12 to the flip-flop 40 output node A1 by the FET 20, as described in connection with FIG. 1.

The load circuits 12 of the flip-flop 40 described above can, of course, also be each replaced by circuit 16 in accordance with FIG. 2.

It is also within the scope of this invention to employ circuits using n-channel field effect transistors or p-channel field effect transistors by correspondingly reversing the polarity of the operating voltages.

While the invention has been particularly shown and described with reference to the preferred embodiment thereof, it will be understood by those skilled in the art that the foregoing and other changes in form and detail may be made therein without departing from the spirit and scope of the invention.

Having thus described our invention, what we claim as new, and desire to secure by Letters Patent is:

1. A circuit for recharging the input capacity of a circuit connected to the output of an FET driver circuit comprising:

a first FET having a source electrode for supplying current to recharge the input capacitance connected to the output node of the driver circuit, a drain electrode connected to an operating voltage source, and a gate electrode connected to one electrode of a capacitor whose other electrode is connected to a periodic pulse source, a second FET having its source connected to said source of the first FET, a drain electrode connected to the gate of the first FET, and a gate electrode connected to the operating voltage source, said second FET sensing the potential at the source electrode of the first FET and transferring said potential to the gate of said first FET when the output node of the driver circuit is at a low potential with respect to the operating voltage to prevent current flowing through the first FET.

2. A circuit as in claim 1 including:

a third FET between the periodic pulse source and capacitor having a drain electrode connected to the periodic pulse source, a gate electrode connected to its source electrode through a second capacitor, and connected to the output node through a fourth FET whose gate is connected to the operating voltage source.

3. A flip-flop circuit having two branches, each branch of said circuit comprising:

a first FET having a source electrode for supplying current to recharge the input capacitance connected to the output node of the branch of the flip-flop circuit, a drain electrode connected to an operating voltage source, a gate electrode connected to one electrode of a capacitor whose other electrode is connected to a periodic pulse source, a second FET having its source connected to the source of the first FET, a drain electrode connected to the gate of the first FET, and a gate electrode connected to the operating voltage source, said second FET sensing the potential at the source electrode of the first FET and transferring said potential to the gate of said first FET when the output mode of the branch of the flip-flop circuit is at a low potential with respect to the operating voltage to prevent current flowing through the first FET.

4. A flip-flop circuit as in claim 3 wherein each branch further comprises:

A third FET between the periodic pulse source and capacitor having a drain electrode connected to the periodic pulse source, a gate electrode connected to its source electrode through a second capacitor, and connected to the output node through a fourth FET whose gate is connected to the operating voltage source.

* * * * *